(12) United States Patent
Ingenito et al.

(10) Patent No.: US 12,433,060 B2
(45) Date of Patent: Sep. 30, 2025

(54) PHOTOVOLTAIC DEVICE WITH PASSIVATED CONTACT AND CORRESPONDING METHOD OF MANUFACTURE

(71) Applicant: CSEM Centre Suisse d'Electronique et de Microtechnique SA—Recherche et Développement, Neuchâtel (CH)

(72) Inventors: Andrea Ingenito, Neuchâtel (CH); Sylvain Nicolay, Portalban (CH)

(73) Assignee: CSEM CENTRE SUISSE D'ELECTRONIQUE ET DE MICROTECHNIQUE SA—RECHERCHE ET DÉVELOPPEMENT, Neuchâtel (CH)

( * ) Notice: Subject to any disclaimer, the term of this patent is extended or adjusted under 35 U.S.C. 154(b) by 196 days.

(21) Appl. No.: 18/550,240

(22) PCT Filed: Mar. 22, 2022

(86) PCT No.: PCT/EP2022/057488
§ 371 (c)(1),
(2) Date: Sep. 12, 2023

(87) PCT Pub. No.: WO2022/207408
PCT Pub. Date: Oct. 6, 2022

(65) Prior Publication Data
US 2024/0162354 A1 May 16, 2024

(30) Foreign Application Priority Data

Mar. 31, 2021 (EP) .................................... 21166148

(51) Int. Cl.
*H10F 77/30* (2025.01)
*H10F 71/00* (2025.01)
*H10F 77/20* (2025.01)
(52) U.S. Cl.
CPC ......... *H10F 77/311* (2025.01); *H10F 71/129* (2025.01); *H10F 77/211* (2025.01)

(58) Field of Classification Search
CPC .... H10F 77/311; H10F 77/315; H10F 77/211; H10F 71/129
See application file for complete search history.

(56) References Cited

U.S. PATENT DOCUMENTS

| | | | |
|---|---|---|---|
| 6,333,457 | B1 | 12/2001 | Mulligan et al. |
| 7,468,485 | B1 | 12/2008 | Swanson |
| | | (Continued) | |

FOREIGN PATENT DOCUMENTS

| | | | | |
|---|---|---|---|---|
| CN | 108666393 | A | | 10/2018 |
| CN | 108831953 | A | * | 11/2018 ........... H10F 71/129 |
| | | (Continued) | | |

OTHER PUBLICATIONS

English machine translation of He et al. (CN 108831953) published Nov. 16, 2018.*

(Continued)

*Primary Examiner* — Christina Chern
(74) *Attorney, Agent, or Firm* — NIXON & VANDERHYE

(57) ABSTRACT

Disclosed is a photovoltaic device including: —a silicon substrate; —a first tunnel layer situated upon at least a first side of the silicon substrate; —a first polycrystalline silicon-based capping layer situated upon the first tunnel layer; and —a second tunnel layer situated upon substantially the entirety of the first polycrystalline silicon-based capping layer. The photovoltaic device further includes: —a second polycrystalline silicon-based capping layer situated upon predetermined zones of the second tunnel layer, areas of the second tunnel layer situated outside of the predetermined zones being free of the second polycrystalline silicon-based capping layer; and —a metal contact situated upon at least part of the second polycrystalline silicon-based capping layer.

20 Claims, 5 Drawing Sheets

(56) References Cited

U.S. PATENT DOCUMENTS

| | | |
|---|---|---|
| 9,337,369 B2 | 5/2016 | Smith |
| 9,559,245 B2 | 1/2017 | Qiu et al. |
| 9,634,177 B2 | 4/2017 | Rim et al. |

FOREIGN PATENT DOCUMENTS

| | | | | |
|---|---|---|---|---|
| CN | 110752261 A | * | 2/2020 | ........... H10F 71/129 |
| CN | 110828583 A | * | 2/2020 | ........... H10F 71/129 |
| CN | 112447867 A | | 3/2021 | |
| WO | 2017058011 A1 | | 4/2017 | |
| WO | 2020060487 A1 | | 3/2020 | |
| WO | 2020204823 A1 | | 10/2020 | |

OTHER PUBLICATIONS

English machine translation of Yang et al. (CN 110752261) published Feb. 4, 2020.*
English machine translation of Zhang et al. (CN 110828583) published Feb. 21, 2020.*
International Search Report and Written Opinion of the ISA for PCT/EP2022/057488 mailed Jul. 22, 2022, 11 pages.

* cited by examiner

PHOTOVOLTAIC DEVICE WITH PASSIVATED CONTACT AND CORRESPONDING METHOD OF MANUFACTURE

CROSS-REFERENCE TO RELATED APPLICATIONS

This application is the U.S. national phase of International Application No. PCT/EP2022/057488 filed Mar. 22, 2022, which designated the U.S. and claims priority to EP 21166148.3 filed Mar. 31, 2021, the entire contents of each of which are hereby incorporated by reference.

TECHNICAL FIELD

The present invention relates to the field of photovoltaic devices. More particularly, it relates to a photovoltaic device with passivated contacts, and a corresponding method of its manufacture.

STATE OF THE ART

In crystalline silicon solar cells, passivation of the contacts is very important to reduce recombination losses at the contacts and hence to obtain high conversion efficiency of light impinging on the cell into electrical current.

Typically, an ultrathin (<5 nm) dielectric tunnel layer is deposited on the crystalline silicon substrate, e.g. of silicon oxide, upon which a doped polycrystalline silicon (poly-Si) capping layer is formed. Electrical contacts are then selectively applied upon this capping layer, e.g. by screen printing and subsequent curing of silver paste. During curing, which takes place at elevated temperatures to "set" the paste, the underlying poly-Si is often damaged and passivation is reduced as the silver material flows into the surface texture and defects.

The level of passivation attained ends up being a compromise, since a relatively thick poly-Si capping layer provides excellent passivation but absorbs light that would otherwise be converted in the active part of the solar cell. This parasitic light absorption reduces the conversion efficiency of the cell.

For this reason, poly-Si based passivating contacts metallized by screen printing and firing-through are mainly employed on the rear side of a solar cell with a conventional homo-junction on the front. In the quest of high efficiency solar cells, poly-Si passivating contacts are ideally applied on both sides of a solar cell. Therefore, to maximize photogeneration in the absorber layer, poly-Si based passivating contacts need to be arranged in such a way contact recombination is reduced, high passivation levels are maintained over the full wafer surface without creating excessive parasitic optical losses. It is noted that such losses are in the infrared response of the solar cell spectral response due to free carrier absorption (FCA) if the doped poly-Si is only on the rear side. If the poly-Si passivating contact is applied also on the front or on both sides of the solar cell, optical losses occur in the UV, visible and infrared regions of the solar cell spectral response.

Document WO 2020/204823 discloses a photovoltaic device with a back side layer stack comprising, disposed on a silicon substrate, the sequence of a full-surface first tunnel layer, a full-surface first polycrystalline silicon-based capping layer, a full-surface second tunnel layer, a full-surface second polycrystalline silicon-based capping layer, and metal contacts. Since all the layers in question other than the metal contacts are full-surface, the cell performance is far from optimal.

An aim of the present invention is thus to at least partially overcome the drawbacks of the prior art.

DISCLOSURE OF THE INVENTION

More precisely, the invention relates to a photovoltaic device comprising:
- a silicon substrate, typically a monocrystalline silicon wafer, which may be doped, undoped, or only doped in certain zones, particularly at its surface;
- a first tunnel layer situated upon at least a first side of said silicon substrate;
- a first polycrystalline silicon-based capping layer situated upon said first tunnel layer. Depending on the cell configuration, first polycrystalline silicon-based capping layer may be full area or may be patterned. It should also be noted that the first polycrystalline silicon-based capping layer may be polycrystalline silicon itself, or polycrystalline silicon carbide, polycrystalline silicon oxide or similar, these substances being silicon-based;
- a second tunnel layer situated upon substantially the entirety of said first polycrystalline silicon-based capping layer;

According to the invention, said photovoltaic device further comprises:
- a second polycrystalline silicon-based capping layer situated upon predetermined zones of said second tunnel layer, areas of said second tunnel layer situated outside of said predetermined zones being free of said second polycrystalline silicon-based capping layer (i.e. do not have the second polycrystalline silicon-based layer situated thereupon); and
- a metal contact situated directly or indirectly upon at least part of said second polycrystalline silicon-based capping layer, this metal contact being a layer configured as pads, fingers or similar so as to constitute the electrical contacts of the device.

Doping (or lack thereof) of the silicon substrate and the various layers mentioned above can be arranged as required, and the invention is not limited to a particular dopant configuration. Furthermore, the layers mentioned above can be provided on one or both sides of the substrate.

As a result, the metal is kept away from the interface between the silicon substrate and the first tunnel layer (which forms the passivating contact interface), eliminating damage thereto e.g. during the thermal curing of silver paste used for the metal contact, or during deposition thereof if by PVD. The non-contacted areas outside of said zones are not provided with the second polycrystalline silicon-based capping layer, meaning that the thickness of the polycrystalline silicon-based material in these areas can be as thin as possible to minimise parasitic light absorption. The passivation of the contacts is hence maximised, and the parasitic light absorption is minimised, improving cell efficiency, fill factor, open source voltage and short-circuit current.

Advantageously, first tunnel layer is made of a dielectric material, and said second tunnel layer is made of a dielectric material or a semiconductor alloy, this latter not impeding vertical charge transport (i.e. charge transport in a direction perpendicular to the plane of the substrate).

Advantageously, at least one of said first polycrystalline silicon-based capping layer and said second polycrystalline silicon-based capping layer is made of polycrystalline silicon, with or without hydrogenation.

Advantageously, said second polycrystalline silicon-based capping layer has the same dopant type as said first polycrystalline silicon-based capping layer in the corresponding predetermined zone, that is to say in the underlying first polycrystalline silicon-based capping layer. Charge collection is hence optimised.

Advantageously, said second polycrystalline silicon-based capping layer has a dopant concentration which is greater than that of said first polycrystalline silicon-based capping layer in the corresponding predetermined zone.

Advantageously, said metal contact is of silver, silver/aluminium, aluminium or copper paste.

Advantageously, one or more of the following is true:
said first tunnel layer has a thickness of between 0.5 nm and 5 nm, preferably between 0.5 nm and 1.5 nm, further preferably between 0.5 nm and 1 nm; and/or
said first polycrystalline silicon-based capping layer has a thickness of between 5 nm and 100 nm, preferably between 10 nm and 50 nm; and/or
said second tunnel layer has a thickness of between 0.5 nm and 5 nm, preferably between 0.5 nm and 1.5 nm, further preferably between 0.5 nm and 1 nm; and/or
said second polycrystalline silicon-based capping layer has a thickness of greater than 5 nm, preferably between 5 nm and 200 nm.

The invention also relates to a method of manufacturing a photovoltaic device as described above, the method comprising steps of:
a) providing a silicon substrate, typically a monocrystalline silicon wafer which may be doped, undoped, or only doped in certain zones, particularly at its surface; subsequently
b) forming a first tunnel layer situated upon at least a first side of said silicon substrate; subsequently
c) forming a first polycrystalline silicon-based capping layer upon said first layer, either substantially full-area, or in a patterned fashion depending on the cell configuration;
d) forming a second tunnel layer upon substantially the entirety of said first polycrystalline silicon-based capping layer;

According to the invention, the method further comprises:
e) forming a second polycrystalline silicon-based passivation layer upon said second tunnel layer in predetermined zones, areas of said second tunnel layer situated outside of said predetermined zones being free of said second polycrystalline silicon-based capping layer; and
f) forming a metal contact upon at least part of said second polycrystalline silicon-based capping layer, this metal serving as the contacts for the device.

Doping (or lack thereof) of the silicon substrate and the various layers mentioned above can be arranged as required, and the invention is not limited to a particular dopant configuration. Furthermore, the layers mentioned above can be provided on one or both sides of the substrate.

As a result, the metal is kept away from the interface between the silicon substrate and the first tunnel layer (which forms the passivating contact interface), eliminating damage thereto e.g. in the case thermal curing of silver paste used for the metal contact. The non-contacted areas outside of said zones are not provided with the second polycrystalline silicon-based capping layer, meaning that the thickness of the polycrystalline silicon-based material in these areas can be as thin as possible to minimise parasitic light absorption. The passivation of the contacts is hence maximised, and the parasitic light absorption is minimised, improving cell efficiency, fill factor, open source voltage and short-circuit current.

Advantageously, e) further comprises substeps of:
e1) forming said second polycrystalline silicon-based capping layer upon substantially the entirety of said second tunnel layer; subsequently
e2) selectively removing said second polycrystalline silicon-based capping layer outside of said predetermined zones so as to expose said second tunnel layer in areas outside of said predetermined zones.

This is a particularly efficient and simple method to pattern the second polycrystalline silicon-based capping layer. However, in an alternative method, second polycrystalline silicon-based capping layer can be deposited in a patterned fashion, e.g. by masking followed by deposition.

Advantageously, said first tunnel layer is made of a dielectric material, and said second tunnel layer is made of a dielectric material or a semiconductor alloy.

Advantageously, at least one of said first polycrystalline silicon-based capping layer and said second polycrystalline silicon-based capping layer is made of polycrystalline silicon.

Advantageously, said second polycrystalline silicon-based capping layer has the same dopant type as said first polycrystalline silicon-based capping layer in the corresponding predetermined zone, that is to say in the underlying first polycrystalline silicon-based capping layer. Charge collection is hence optimised.

Advantageously, said second polycrystalline silicon-based capping layer has a dopant concentration which is greater than that of said first polycrystalline silicon-based capping layer in the corresponding predetermined zone.

Advantageously, said metal contact is of silver or aluminium or silver/aluminium or Cu paste.

Advantageously, one of the following is true:
said first tunnel layer has a thickness of between 0.5 nm and 5 nm, preferably between 0.5 nm and 1.5 nm, further preferably between 0.5 nm and 1 nm; and/or
said first polycrystalline silicon-based capping layer has a thickness of between 5 nm and 100 nm, preferably between 10 nm and 50 nm; and/or
said second tunnel layer has a thickness of between 0.5 nm and 5 nm, preferably between 0.5 nm and 1.5 nm, further preferably between 0.5 nm and 1 nm; and/or
said second polycrystalline silicon-based capping layer has a thickness of greater than 5 nm, preferably between 10 nm and 200 nm.

BRIEF DESCRIPTION OF THE DRAWINGS

Further details of the invention will become apparent upon reading the detailed description below, in reference to the annexed figures in which.

EMBODIMENTS OF THE INVENTION

Figure 1:
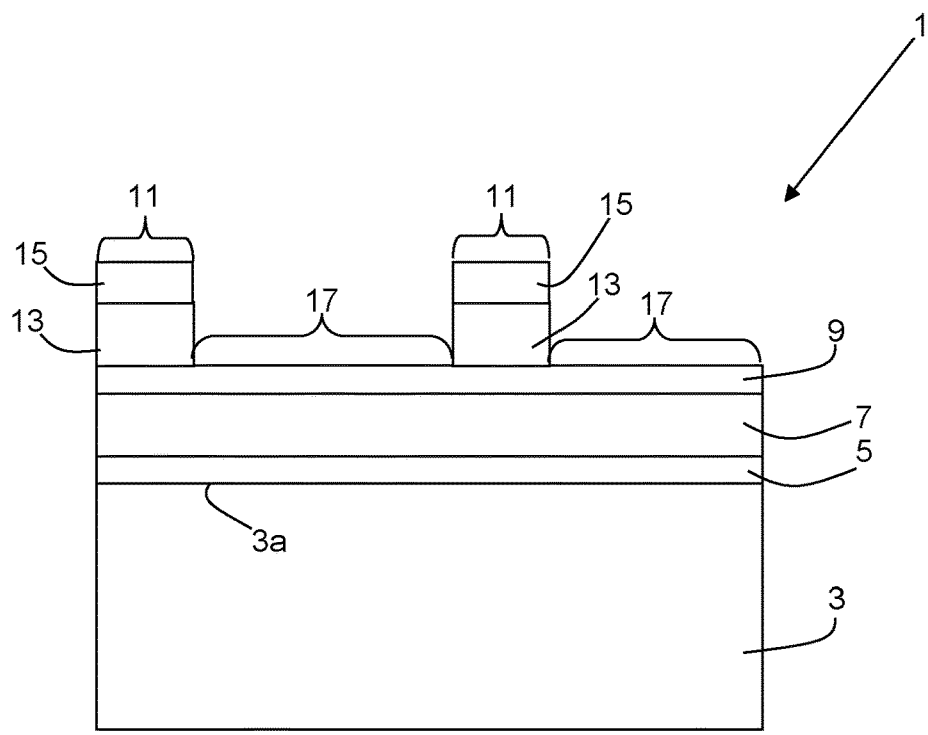
FIG. 1 is a schematic cross-sectional view of part of a photovoltaic device according to the invention.

FIG. 1 illustrates schematically part of a photovoltaic device 1 according to the invention, only the features necessary for the understanding of the invention having been represented, namely the configuration of passivated contacts forming the core of the invention and all other layers having been omitted. The various layers are represented schematically, and relative thicknesses are not to be imputed from the drawings.

Photovoltaic device 1 comprises a silicon substrate 3, typically monocrystalline silicon in the form of a wafer or a multicrystalline substrate as is generally known. Depending on the type of photovoltaic device, this substrate 3 may be undoped, uniformly doped, doped in various zones, either on one side, or both sides of the wafer, or similar. Since the principle of the invention applies to many types of solar cells based on a monocrystalline silicon wafer whether back side contacted, front side contacted or bifacially contacted, no further discussion on this point is required.

On a first face 3a of said wafer is provided a first tunnel layer 5, made for instance of a dielectric material such as $SiO_x$, $SiN_x$, $SiON_x$, $AlN_x$, or $AlON_x$ of any convenient stoichiometry. This layer typically has a thickness of less than 5 nm, preferably less than 1.5 nm or even less than 1 nm but typically more than 0.5 nm, and is deposited over substantially the whole surface of the substrate 3. This thickness is sufficiently small to enable charge carriers (electrons or holes, depending on the case) to pass through by tunnelling.

Upon a face of the first tunnel layer 5 which faces away from the substrate 3 is provided a first polycrystalline silicon-based capping layer 7, which may be doped or undoped. In the present embodiment, the first polycrystalline silicon-based capping layer 7 is provided upon substantially the entirety of said face of the first tunnel layer, but as can be seen from FIG. 9 (see below), under certain circumstances in function of the cell configuration, the first polycrystalline silicon-based capping layer 7 can be patterned. The term "polycrystalline silicon-based layer" should be understood as designating a polycrystalline layer formed of a silicon-based material such as Si itself, $SiO_x$, $SiC_x$ or $SiN_x$, this material optionally being hydrogenated. In terms of the level of crystallinity, a Raman crystallinity of at least 5%, preferably at least 20% is typically adequate. Thickness is typically between 5 nm and 100 nm, preferably between 10 nm and 50 nm.

Upon substantially the entirety of a face of the first polycrystalline silicon-based capping layer 7 which faces away from the substrate 3 is provided a second tunnel layer 9, which is either a dielectric tunnel layer subject to the same constraints in terms of materials and thickness as the first tunnel layer 5, or a semiconductor alloy tunnel layer. In the case in which both tunnel layers 5, 9 are dielectrics, they do not have to be identical. In terms of semiconductor alloys, Si—O, Si—N, Si—C and $AlON_x$ alloy layers can be used, with a thickness less than 10 nm, preferably less than 5 nm, further preferably less than 1.5 nm, and greater than 0.5 nm.

In predetermined zones 11 of the surface of the second dielectric tunnel layer 9 facing away from the substrate 3, a second polycrystalline silicon-based capping layer 13 is provided, which may be doped or undoped, may be hydrogenated and preferably has the same dopant type (or lack thereof) as the first polycrystalline silicon-based capping layer 7, although this does not have to be the case. Advantageously, both the polycrystalline silicon-based capping layers 7, 13 are doped with the same type of dopant (P-type or N-type), and the second polycrystalline silicon-based capping layer 13 has a higher dopant concentration than the first polycrystalline silicon-based capping layer 7, which helps maximise charge carrier extraction. This layer is thicker than 5 nm, typically between 10 nm and 200 nm, preferably 50 to 150 nm.

Finally, metal contacts 15 are situated directly or indirectly upon the second polycrystalline silicon-based capping layer 13, again on a surface thereof facing away from the substrate 3. For instance, it is not to be excluded that a further tunnel layer and/or a further capping layer (or several) could be provided between the second polycrystalline silicon-based capping layer 13 and the metal contacts 15.

In areas 17 situated outside of said predetermined zones 11, the second dielectric tunnel layer 9 is left exposed, which ensures a minimum of parasitic light absorption.

The layers 5, 7, 9, 13 and 15 can be applied to either the front side (i.e. the light-incident side) of the photovoltaic device 1, to the back side (i.e. the shaded side), or to both sides, depending on the type of solar cell being implemented. Furthermore, each of said layers 5, 7, 9, 13 and 15 are preferably provided directly upon the underlying layer (or substrate in the case of the first tunnel layer 5), although the presence of intervening layers is not to be excluded.

The structure of the photovoltaic device 1 according to the invention having been described in reference to FIG. 1, a particularly advantageous but non-limiting method of its fabrication will now be described in reference to FIGS. 2-4.

Figure 2:
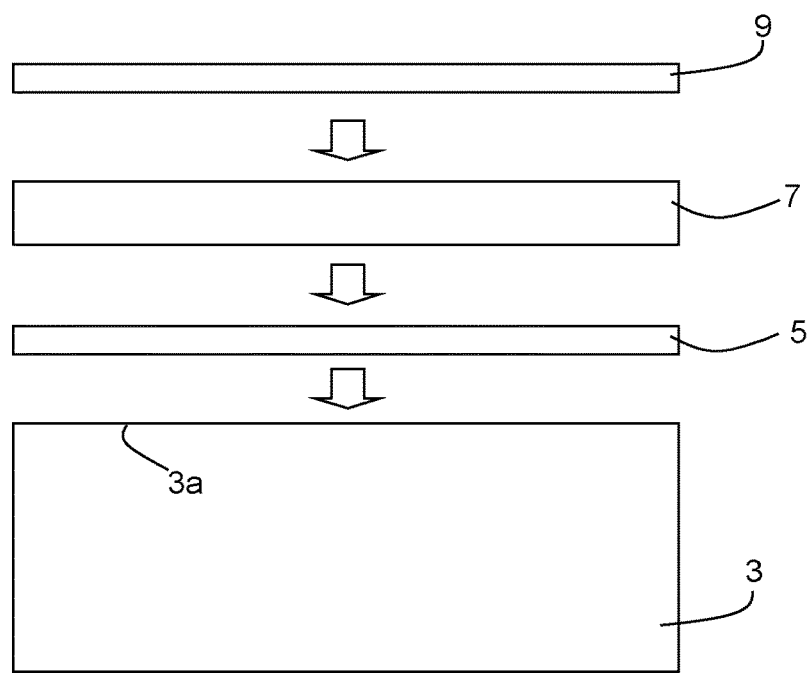
FIGS. 2-4 are schematic cross-sectional views of various steps of a method according to the invention.

FIG. 2 represents the sequence of steps to form the portion of the layer stack comprising silicon substrate 3, first tunnel layer 5, first polycrystalline silicon-based capping layer 7, and second dielectric tunnel layer 9.

Firstly, silicon substrate 3 is provided, as described above.

Subsequently, first tunnel layer 5 is formed upon a surface of the silicon substrate, for example by means of growth through oxidation, nitridation or similar of the surface, or by deposition such as a chemical vapour deposition process (e.g. APCVD, LPCVD etc., with or without plasma enhancement), physical vapor deposition (sputtering) or similar. This layer 5 is typically undoped, but a dopant can be included during deposition, as is generally known.

Subsequently, first polycrystalline silicon-based capping layer 7 is formed upon the first tunnel layer 5, preferably directly thereupon without deposition or formation of an intervening layer. This is typically carried out by a physical vapour deposition (PVD, with or without plasma enhancement) or a chemical vapour deposition process (PECVD, LPCVD), depending on the material chosen, as is generally known.

Subsequently, second tunnel layer 9 is formed upon substantially the entirety of the first polycrystalline silicon-based capping layer 7, preferably directly thereupon without deposition or formation of an intervening layer, either by being grown thereupon (e.g. by a hot nitric acid process, ozonate deionised water, UV-Ozone, or other oxidation process), or is deposited thereupon by PVD, CVD, atomic layer deposition (ALD) or similar, depending on the material chosen. This is ideally carried out in the same deposition tool as for the first polycrystalline silicon-based capping layer 7.

Figure 3:
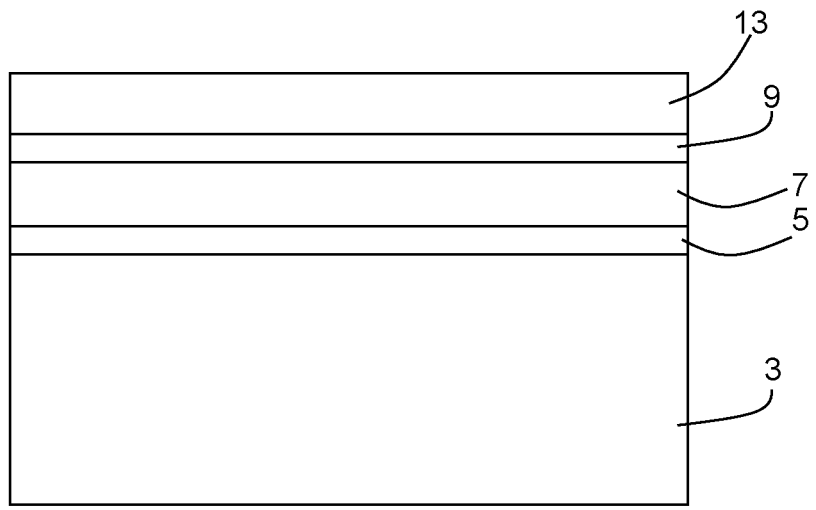
Figure 4:
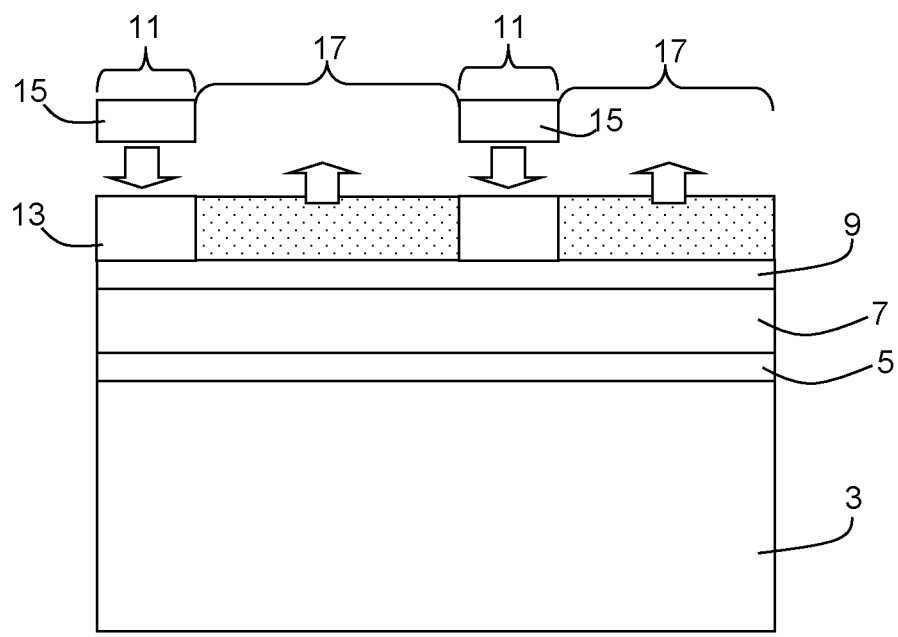

Moving now to FIG. 3, the second polycrystalline silicon-based capping layer 13 is then formed on the surface of the second tunnel layer 9, preferably directly thereupon without deposition or formation of an intervening layer, typically by means of PVD, LPCVD or PECVD, with an optional dopant being incorporated during deposition.

Although this deposition can be carried out selectively, e.g. by masking off the areas 17 which will not ultimately be provided with the second polycrystalline silicon-based capping layer 13, in the illustrated embodiment this layer is provided over substantially the entirety of the second tunnel layer 9, and then as shown in FIG. 13, is selectively removed from the areas 17.

This can be carried out my any known means, such as applying an etching mask in the zones 11 (not illustrated) followed by dry or wet etching, laser ablation, laser crystallisation of the polysilicon layer 13 in the areas 17 followed by etching of the crystallised region.

Advantageously, the polysilicon layer 13 is masked and the etching is carried out by means of a wet process, in an etching solution of deionized water and ammonia, potassium hydroxide, sodium hydroxide, tetramethylammonium hydroxide, or tetraethylammonium hydroxide.

More preferably the etching solution in potassium hydroxide at a concentration of 1M to 6M, preferably 1M to 3M.

The etching step is advantageously performed at temperature between 20° C. and 100° C., for instance at room temperature (20-25° C.).

Under some conditions, the wet etching process may result in the formation of a porous silicon layer, which can be subsequently etched in wet solutions such as hydrofluoric acid.

None of the etchants mentioned above are capable of etching the material of the second tunnel layer 9, which hence acts as an etch stop leaving a clean and transparent surface, without requiring precise process control.

An annealing process can be carried out either before or after patterning of the second polycrystalline silicon-based capping layer 13, at a temperature of above 700° C., typically between 80° C. and 1050° C. Indeed, it is possible to carry out two annealing steps, one after deposition of the first polycrystalline silicon-based capping layer 7, and one after deposition of the second polycrystalline silicon-based capping layer 13.

Finally, subsequent to the formation and/or patterning of the second polycrystalline silicon-based capping layer 13, the metal contacts 15 are applied thereto, either in the form of silver paste which is subsequently cured, PVD of any convenient form, metal plating or similar.

As a result, the metal electrode is only in contact with the second polysilicon layer 7, which eliminates damage induced by the metallization process. Since such damage reduces passivation, keeping the metal away from the substrate/passivating contact interface (i.e. the substrate 3/first tunnel layer 5 interface) eliminates this and hence improves the overall cell efficiency, while keeping the first polycrystalline silicon-based capping layer 7 as thin as possible in the areas 17 not used for contacting (i.e. the areas outside the zones 11).

After patterning of the second polycrystalline silicon-based capping layer 15 and application of the metal contacts 15, the structure of FIG. 1 is obtained, which can then be subjected to other manufacturing steps, interconnection, encapsulation etc. as is generally known in the art. For instance, a dielectric layer such as SiN can be provided in the areas 17 not used for contacting. Other layers required for forming the complete photovoltaic device 1 can be formed as is generally know, at any convenient point in the process.

In the case of a bifacially-contacted photovoltaic device 1, the steps can be carried out sequentially on each side of the substrate 3, or if appropriate, at least certain steps can be carried out simultaneously.

Other modifications of the above-described method are also possible. For instance, in the case in which any of the layers 5, 7, 9, 13 are doped, rather than providing a dopant precursor in the deposition process, dopants may be applied in a supplementary processing step. Such a supplementary processing step may be ion implantation or deposition of a supplemental layer containing dopant which is then diffused into the underlying layer, followed by removal of said supplemental layer may be carried out.

Furthermore, it is not excluded that other intervening layers are present in the layer stack, particularly (but not exclusively) between the substrate 3 and the first tunnel layer 5, however it is preferable that the layers are provided in the sequence described, without extra layers being present therebetween.

Figure 5:
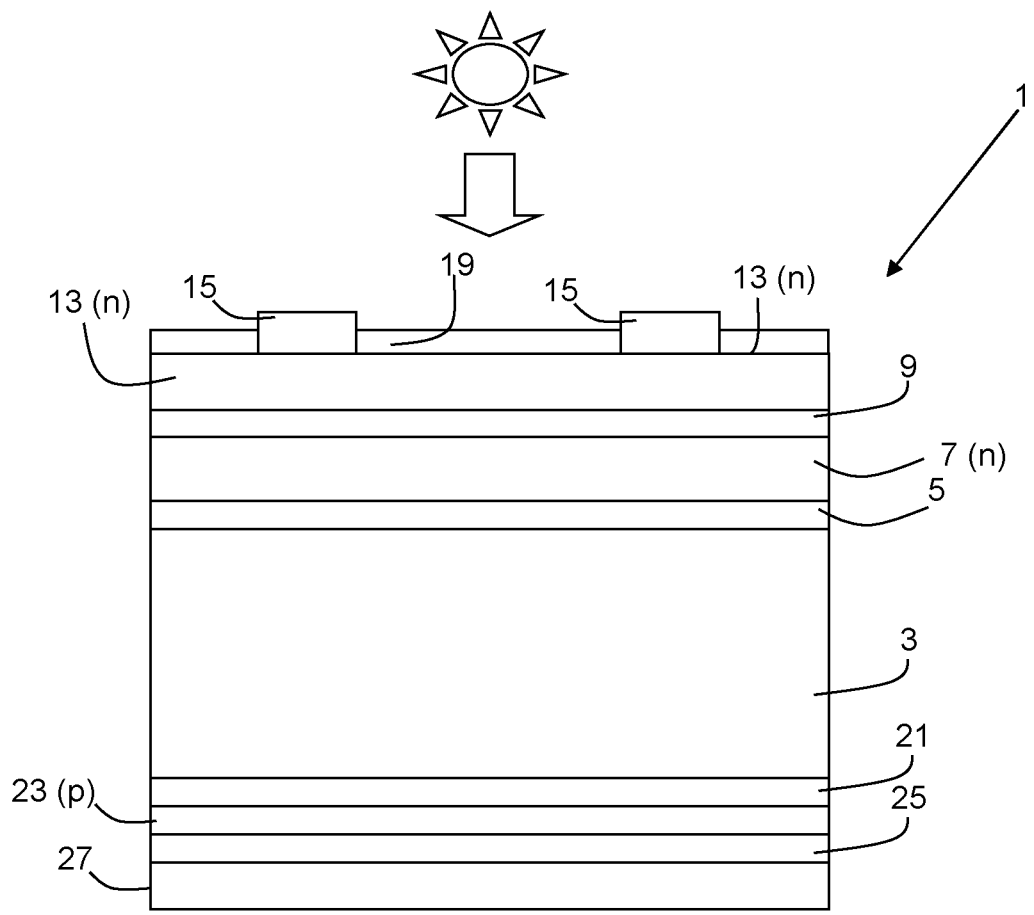
FIG. 5 is a schematic cross-sectional view of a test photovoltaic cell.

Experiments were carried out by forming a number of identical cells 1 as illustrated in FIG. 5 on the same wafer, with different thicknesses of second tunnel layer 9, and as a comparison, with cells in which the second tunnel layer 9 was omitted. In each case, the second polycrystalline silicon-based capping layer 13 covers the full area of the cell 1, and as a result, this cell 1 does not correspond to the invention but rather forms a proof of concept to prove that the second tunnel layer 13 does not impede charge extraction, and indeed improves the performance of the cell. Where appropriate, the doping types of the various layers has been indicated.

The substrate 3 was a float zone crystalline silicon wafer with a thickness of 180 μm and doped with phosphorus with a resistivity of 2 Ω·cm. First tunnel layer 5 is of $SiO_x$ with a thickness of approximately 1.2 nm. First polycrystalline silicon-based capping layer 7 is of Poly-Si, with a thickness of approximately 10 nm and is doped phosphorus doped. Second tunnel layer 9 is the same as first tunnel layer 5, except that the thickness has been varied between 0 nm and 1.9-2.5 nm (30 second deposition time). Second polycrystalline silicon-based capping layer 7 is of the same material, doping type and dopant concentration as the first polycrystalline silicon-based capping layer 7, with a thickness of approximately 100 nm. In each case, the cells were annealed at 850° C. for 30 minutes. Metal contacts 15 are of screen printed silver paste, and the areas of the surface of the second capping layer 13 outside of the metal contacts 15 is covered with a dielectric layer 19 of silicon nitride. The $SiN_x$ 19 improves the optical and electrical properties (since it provides passivating atoms) of the solar cell. It is also possible to apply the dielectric layer 19 over the whole surface, and when the metal contacts 15 are fired, spikes of metal are driven through the dielectric layer 19 making direct electrical contact with the underlying layer 13, rendering the dielectric layer 19 non-functional under the metal contacts 15. This simplifies production compared to depositing the dielectric layer 19 in a patterned fashion, or compared to full area deposition and subsequent local removal where the contacts 15 are intended to be situated. This applies to every instance of the dielectric layer 19, and also to dielectric layer 29 (see below).

On the opposite side of the substrate 3 is provided a substantially full-area layer stack comprising, in a direction moving away from the substrate 3, a back side tunnel layer 21 of $SiO_x$, a p-type doped capping layer of polysilicon 23, a transparent conductive oxide layer 25 of indium tin oxide, and a back contact 27 of silver.

The results are reported in the following tables, in which $V_{oc}$ is the open circuit voltage, FF is fill factor, and $J_{sc}$ is the short circuit current.

TABLE 1 second tunnel layer 9 omitted:

| Cell No. | Efficiency (%) | $V_{oc}$ (mV) | FF (%) | $J_{sc}$ (mA/cm$^2$) |
|---|---|---|---|---|
| 1 | 17.11 | 672.0 | 74.34 | 34.26 |
| 2 | 15.90 | 679.4 | 69.27 | 33.79 |
| 3 | 14.70 | 688.6 | 64.14 | 33.29 |
| 4 | 15.76 | 684.9 | 68.85 | 33.43 |
| 5 | 17.70 | 692.3 | 66.00 | 64.33 |
| Average | 15.83 | 683.4 | 68.52 | 33.82 |

TABLE 2 second tunnel layer 9 deposition time 9 sec:

| Cell No. | Efficiency (%) | $V_{oc}$ (mV) | FF (%) | $J_{sc}$ (mA/cm$^2$) |
|---|---|---|---|---|
| 1 | 17.42 | 692.2 | 73.33 | 34.32 |
| 2 | 17.16 | 684.7 | 74.32 | 33.71 |
| 3 | 18.00 | 691.6 | 75.6 | 34.42 |
| 4 | 18.51 | 696.0 | 76.56 | 34.73 |
| 5 | 18.35 | 691.8 | 76.98 | 34.46 |
| Average | 17.89 | 691.3 | 75.36 | 34.33 |

TABLE 3 second tunnel layer 9 deposition time 30 sec (thickness approx. 1.9-2.5 nm):

| Cell No. | Efficiency (%) | $V_{oc}$ (mV) | FF (%) | $J_{sc}$ (mA/cm$^2$) |
|---|---|---|---|---|
| 1 | 13.94 | 710.1 | 56.87 | 34.52 |
| 2 | 14.96 | 710.1 | 61.19 | 34.43 |
| 3 | 10.61 | 692.9 | 47.83 | 32.02 |
| 4 | 14.89 | 706.0 | 62.54 | 33.72 |
| 5 | 14.76 | 703.6 | 61.90 | 33.89 |
| Average | 13.83 | 704.5 | 58.07 | 33.72 |

As can be seen from the foregoing, a second tunnel layer 9 deposited for 9 seconds gives the best cell performance on all metrics, whereas a thicker layer, when deposited for 30 seconds, gives a wider range of results, which are poorer, possibly due to impeding charge carrier extraction.

In respect of why the thickness of the second tunnel layer 9 corresponding to a 9 second deposition time gives the best results, possible explanations are that:
 the microstructural layer properties of the second polycrystalline silicon-based capping layer 13 are changed by the presence of the second tunnel layer 9;
 the second tunnel layer 9 influences the re-crystallisation of the poly-Si of the capping layer. The presence of the second tunnel layer 9 causes the two poly-Si layers 7, 13 to recrystallise independently, rather than as a unitary layer with crystals extending throughout the whole of the poly-Si;
 the second tunnel layer 9 influences dopant diffusion, retarding its passage into the substrate 3;
 the second tunnel layer 9 provides a barrier against penetration of silver paste into the layer stack.

FIGS. 6-9 illustrate various non-limiting structures of portions of photovoltaic cells 1 according to the invention, incorporating the passivating contacts forming the core of the invention. The doping types of various layers having been indicated where appropriate, and as is generally known, the dopant types can be inverted. Furthermore, the direction of incident light has been indicated by a sun symbol and a large arrow.

Figure 6:
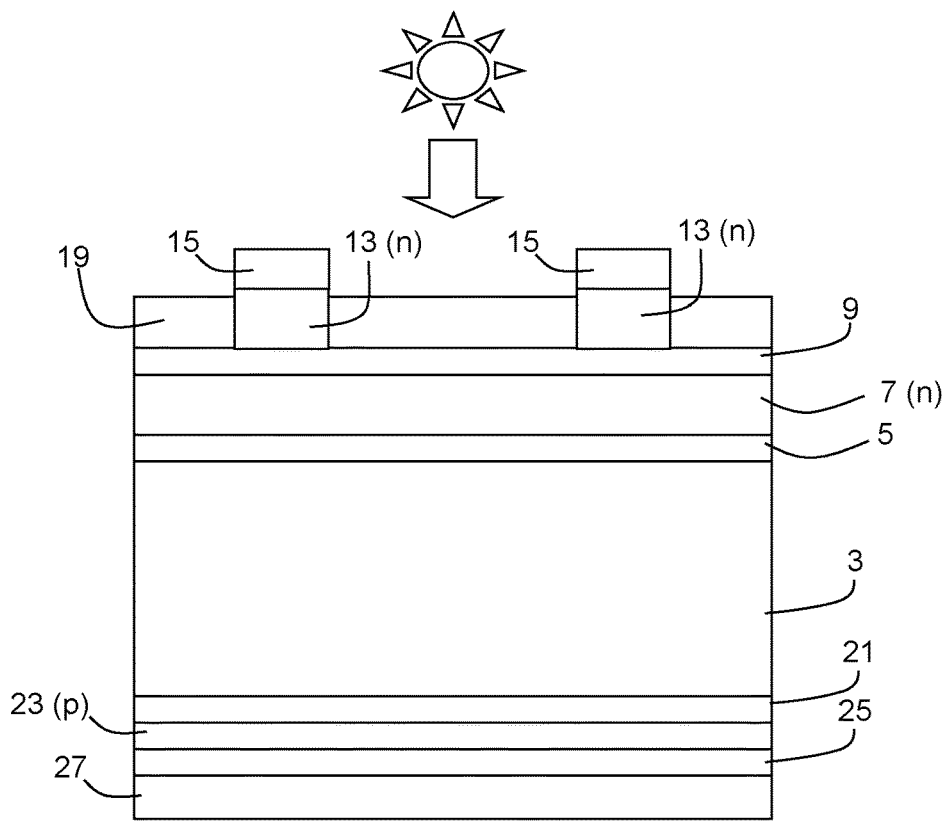
FIGS. 6-9 are schematic cross-sectional views of parts of various configurations of photovoltaic devices according to the invention.

FIG. 6 illustrates a portion of a photovoltaic cell 1 which, on the front side of its substrate 3, i.e. the side intended to face the direction of incident light, comprises the layers 5, 7, 9, 13 and 15 as described in the context of FIG. 1, together with a dielectric layer 19 (such as SiN or other) provided on areas of the surface of the second tunnel layer 9 not covered by the second capping layer 13. On the opposite, shaded side of the substrate 3 (rear side) is provided the sequence of layers 21, 23, 25, 27 as disclosed in the context of FIG. 5.

Figure 7:
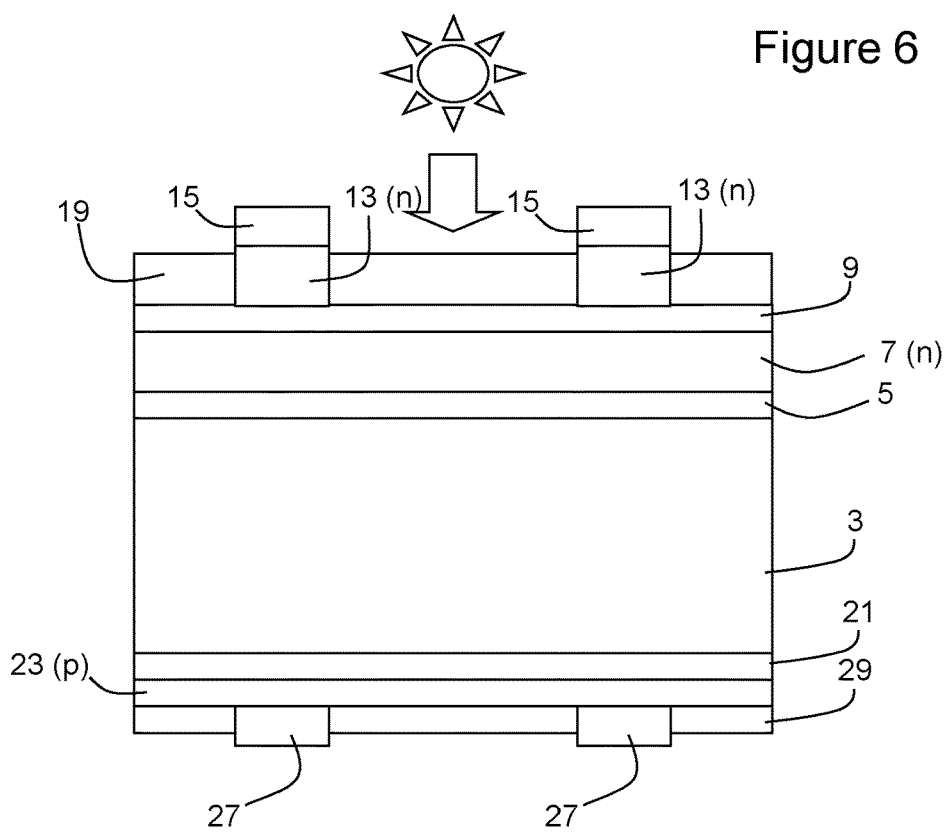

FIG. 7 illustrates another portion of a photovoltaic cell 1 which differs from that of FIG. 6 in that, on the rear side, the transparent conductive oxide layer 25 has been omitted, and the back contacts 27 are a patterned metal layer e.g. of silver paste. A dielectric layer 29, similar to dielectric layer 19, is provided on the areas of the layer 23 which are not covered by the back contacts 27. Alternatively, the dielectric layer 29 can be provided over the whole surface, and when the patterned metal layer 27 e.g. of silver paste is fired, metal spikes are driven through the dielectric layer, making an electrical connection therethrough and rendering it redundant under the metal layer 27. However, this simplifies production as noted above in the context of dielectric layer 19.

Figure 8:
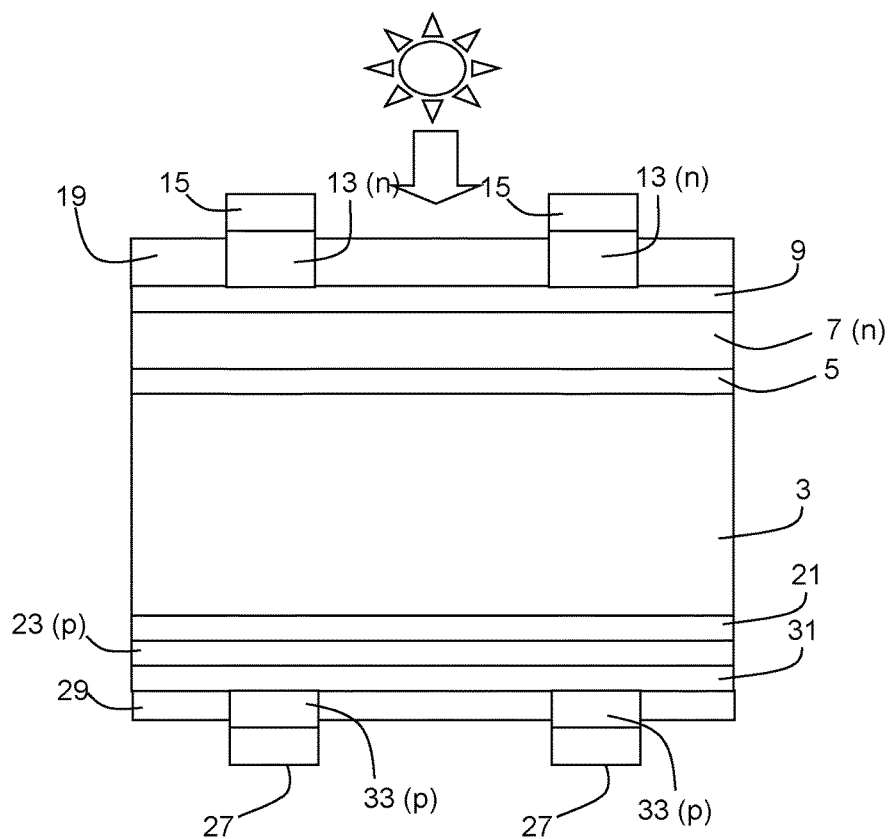

FIG. 8 illustrates another portion of a photovoltaic cell 1 which differs from that of FIG. 7 in that, on the rear side, a similar configuration of passivating contact is provided as that on the front side. Hence, capping layer 23 is coated with a further tunnel layer 31 similar to the front side tunnel layers 5, 9, and then in certain zones, a further capping layer 33 is provided which is analogous to second capping layer 13 but of opposite doping, mutatis mutandis.

Figure 9:
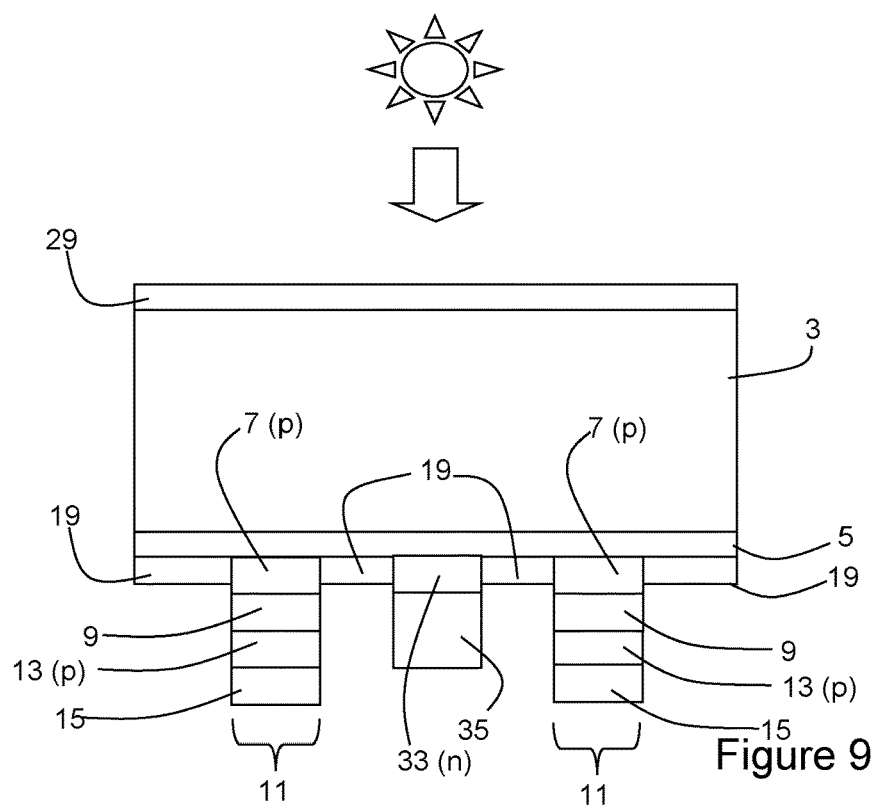

Finally, FIG. 9 illustrates a portion of a back-contacted photovoltaic device 1 incorporating passivating contacts according to the invention. On the light-incident side of the substrate 3 is simply provided a dielectric layer 29 similar to that above. On the back side, a substantially full area first tunnel layer 5 is provided, and then in the zones 11, first polycrystalline silicon-based capping layer 7 is provided in a patterned fashion, and then the remainder of the layer stack 7, 9, 13 is provided thereupon and topped with metal contacts 15 as above, the doped layers 7 and 13 having p-type doping of a first type. The modifications to the process described above in order to pattern the first capping layer 7 are known to the skilled person (e.g. deposition followed by masking and etching, laser ablation or similar, or masking followed by deposition and mask removal) and need not be explained in detail here.

Between each zone 11, and out of contact with the layer stacks in the zones 11, is provided a patterned polycrystalline silicon layer 33 with n-type doping. This polycrystalline silicon layer 33 is topped with further metal contact layer 33. The areas of the first tunnel layer 5 not covered by layer 7 or 33 is coated with a dielectric layer 19 as above, and it is also possible to deposit dielectric layer 19 over the entirety of the surface after deposition of the second polycrystalline silicon-based capping layer 13, including the vertical surfaces of the layer stacks in the zone 11, followed by local removal in the zones 11 or simply by allowing the metal of the contacts 15 to penetrate therethrough during firing. Furthermore, it is possible for the contacts 15 to cover less than the entirety of the zones 11. This global cell configuration is well known in the art, and further description of its functioning need not be required, however it is clear how the layer stack comprising layer 5, 7, 9, 13 is applied with this configuration so as to obtain a photovoltaic device according to the invention.

Although the invention has been described in terms of specific embodiments, variations thereto are possible without departing from the scope of the invention as defined by the appended claims.

The invention claimed is:

1. Photovoltaic device comprising:
   a silicon substrate;
   a first tunnel layer situated upon at least a first side of said silicon substrate;
   a first polycrystalline silicon-based capping layer situated upon said first tunnel layer;
   a second tunnel layer situated upon substantially the entirety of said first polycrystalline silicon-based capping layer;
   wherein said photovoltaic device further comprises:
   a second polycrystalline silicon-based capping layer situated upon predetermined zones of said second tunnel layer, areas of said second tunnel layer situated outside of said predetermined zones being free of said second polycrystalline silicon-based capping layer; and
   a metal contact situated upon at least part of said second polycrystalline silicon-based capping layer.

2. The photovoltaic device according to claim 1, wherein said first tunnel layer is made of a dielectric material, and said second tunnel layer is made of a dielectric material or a semiconductor alloy.

3. The photovoltaic device according to claim 1, wherein at least one of said first polycrystalline silicon-based capping layer and said second polycrystalline silicon-based capping layer is made of polycrystalline silicon with or without hydrogenation.

4. The photovoltaic device according to claim 1, wherein said second polycrystalline silicon-based capping layer and said first polycrystalline silicon-based capping layer are doped, and wherein said second polycrystalline silicon-based capping layer has the same dopant type as said first polycrystalline silicon-based capping layer in the corresponding predetermined zone.

5. The photovoltaic device according to claim 4, wherein said second polycrystalline silicon-based capping layer has a dopant concentration which is greater than that of said first polycrystalline silicon-based capping layer in the corresponding predetermined zone.

6. The photovoltaic device according to claim 1, wherein said metal contact is of silver, AgAl, aluminium or copper paste.

7. The photovoltaic device according to claim 1, wherein:
   said first tunnel layer has a thickness of between 0.5 nm and 5 nm; and/or
   said first polycrystalline silicon-based capping layer has a thickness of between 5 nm and 100 nm; and/or
   said second tunnel layer has a thickness of between 0.5 nm and 5 nm; and/or
   said second polycrystalline silicon-based capping layer has a thickness of greater than 5 nm.

8. Method of manufacturing a photovoltaic device, comprising steps of:
   a) providing a silicon substrate;
   b) forming a first tunnel layer situated upon at least a first side of said silicon substrate;
   c) forming a first polycrystalline silicon-based capping layer upon said first layer;
   d) forming a second tunnel layer upon substantially the entirety of said first polycrystalline silicon-based capping layer;
   wherein said method further comprises:
   e) forming a second polycrystalline silicon-based passivation layer upon said second tunnel layer in predetermined zones, areas of said second tunnel layer situated outside of said predetermined zones being free of said second polycrystalline silicon-based capping layer; and
   f) forming a metal contact upon at least part of said second polycrystalline silicon-based capping layer.

9. The method according to claim 8, wherein step e) further comprises substeps of:
   e1) forming said second polycrystalline silicon-based capping layer upon substantially the entirety of said second tunnel layer, subsequently
   e2) selectively removing said second polycrystalline silicon-based capping layer outside of said predetermined zones so as to expose said second tunnel layer in areas outside of said predetermined zones.

10. The method according to claim 8, wherein said first tunnel layer is made of a dielectric material, and said second tunnel layer is made of a dielectric material or a semiconductor alloy.

11. The method according to claim 8, wherein at least one of said first polycrystalline silicon-based capping layer and said second polycrystalline silicon-based capping layer is made of polycrystalline silicon.

12. Method according to claim 8, wherein said second polycrystalline silicon-based capping layer and said first polycrystalline silicon-based capping layer are doped, and wherein said second polycrystalline silicon-based capping layer has the same dopant type as said first polycrystalline silicon-based capping layer in the corresponding predetermined zone.

13. The method according to claim 12, wherein said second polycrystalline silicon-based capping layer has a dopant concentration which is greater than that of said first polycrystalline silicon-based capping layer in the corresponding predetermined zone.

14. The method according to claim 8, wherein said metal contact is of silver, AgAl, aluminium or copper paste.

15. The method according to claim 8, wherein:
   said first tunnel layer has a thickness of between 0.5 nm and 5 nm; and/or
   said first polycrystalline silicon-based capping layer has a thickness of between 5 nm and 100 nm; and/or
   said second tunnel layer has a thickness of between 0.5 nm and 5 nm; and/or
   said second polycrystalline silicon-based capping layer has a thickness of greater than 5 nm.

16. The photovoltaic device according to claim 2, wherein at least one of said first polycrystalline silicon-based capping layer and said second polycrystalline silicon-based capping layer is made of polycrystalline silicon with or without hydrogenation.

17. The photovoltaic device according to claim 2, wherein said second polycrystalline silicon-based capping layer and said first polycrystalline silicon-based capping layer are doped, and wherein said second polycrystalline silicon-based capping layer has the same dopant type as said first polycrystalline silicon-based capping layer in the corresponding predetermined zone.

18. The photovoltaic device according to claim 3, wherein said second polycrystalline silicon-based capping layer and said first polycrystalline silicon-based capping layer are doped, and wherein said second polycrystalline silicon-based capping layer has the same dopant type as said first polycrystalline silicon-based capping layer in the corresponding predetermined zone.

19. The photovoltaic device according to claim 2, wherein said metal contact is of silver, AgAl, aluminium or copper paste.

20. The photovoltaic device according to claim 3, wherein said metal contact is of silver, AgAl, aluminium or copper paste.

\* \* \* \* \*